(12) United States Patent
Usami

(10) Patent No.: US 8,198,718 B2
(45) Date of Patent: Jun. 12, 2012

(54) SEMICONDUCTOR DEVICE WITH STACKED SEMICONDUCTOR CHIPS

(75) Inventor: Toshihiko Usami, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 185 days.

(21) Appl. No.: 12/693,921

(22) Filed: Jan. 26, 2010

(65) Prior Publication Data
US 2010/0213585 A1    Aug. 26, 2010

(30) Foreign Application Priority Data
Feb. 25, 2009    (JP) .................. 2009-042309

(51) Int. Cl.
*H01L 23/556*    (2006.01)
(52) U.S. Cl. ......... 257/686; 257/E23.115; 257/E23.114; 257/E21.504; 257/685; 257/723; 257/777; 257/660; 257/692
(58) Field of Classification Search ............ 257/686, 257/685, 723, 777, 660, 692, E23.115, E23.114, 257/E21.504
See application file for complete search history.

(56) References Cited

U.S. PATENT DOCUMENTS

| | | | |
|---|---|---|---|
| 2004/0051170 A1 | 3/2004 | Kawakami et al. | |
| 2006/0170084 A1* | 8/2006 | Masuda et al. | 257/666 |
| 2007/0296087 A1 | 12/2007 | Ogata et al. | |
| 2008/0174001 A1* | 7/2008 | Aiba et al. | 257/686 |
| 2008/0178463 A1* | 7/2008 | Okubora | 29/830 |
| 2008/0315376 A1* | 12/2008 | Tang et al. | 257/660 |
| 2008/0315404 A1* | 12/2008 | Eichelberger et al. | 257/713 |
| 2011/0127671 A1* | 6/2011 | Yoshikawa et al. | 257/738 |

FOREIGN PATENT DOCUMENTS

| | | |
|---|---|---|
| JP | 2004-111656 A | 4/2004 |
| JP | 2007-227414 A | 9/2007 |

* cited by examiner

*Primary Examiner* — A O Williams
(74) *Attorney, Agent, or Firm* — Foley & Lardner LLP

(57) ABSTRACT

A semiconductor device includes first to third semiconductor chips. The second semiconductor chip is stacked over the first semiconductor chip. The third semiconductor chip is stacked over the second semiconductor chip. The second semiconductor chip shields the first semiconductor chip from noises generated by the third semiconductor chip. The second semiconductor chip shields the third semiconductor chip from noises generated by the first semiconductor chip.

29 Claims, 2 Drawing Sheets

SEMICONDUCTOR DEVICE WITH STACKED SEMICONDUCTOR CHIPS

BACKGROUND OF THE INVENTION

1. Field of the Invention

The present invention relates to a semiconductor device.

Priority is claimed on Japanese Patent Application No. 2009-042309, filed Feb. 25, 2009, the content of which is incorporated herein by reference.

2. Description of the Related Art

Recently, demands for high-density semiconductor devices have been increasing with the introduction of IT and the diffusion of mobile devices. Therefore, miniaturization of BGA (Ball Grid Array) semiconductor devices and MCP (Multi Chip Packaging) for packaging multiple stacked semiconductor chips have progressed.

For example, Japanese Patent Laid-Open Publication Nos. 2007-227414 and 2004-111656 disclose BGA semiconductor devices. FIG. 4 illustrates an example of such a BGA semiconductor device.

A BGA semiconductor device 1 shown in FIG. 4 includes: a wiring board 2 having an upper surface 2a with multiple connection pads 3a, 3b, and 3c thereon and a lower surface 2b with multiple lands 4 thereon electrically connected to the respective connection pads 3a, 3b, and 3c; a first semiconductor chip 6 over the surface 2a of the wiring board 2; a spacer 7 stacked over the first semiconductor chip 6; a third semiconductor chip 8 stacked over the spacer 7; a second semiconductor chip 9 stacked over the third semiconductor chip 8; wires 11a, 11b, and 11c; a seal 12 made of an insulating resin covering at least the semiconductor chips 6, 8, and 9, and the wires 11a, 11b, and 11c; and external terminals 5 that are solder balls or the like on the lands 4.

The wiring board 2 is substantially rectangular in plane view (i.e., when viewed in a direction perpendicular to the surfaces 2a and 2b thereof). The wiring board 2 is, for example, a glass epoxy board having a thickness of, for example, 0.25 mm. Wirings (not shown) are provided on both surfaces of the glass epoxy board. The wirings are covered by a solder resist film 14 that is an insulating film having multiple openings (not shown).

The connection pads 3a, 3b, and 3c are provided on the wirings that are on the surface 2a of the wiring board 2 and exposed through the openings of the solder resist film 14. The lands 4 are provided on the wirings that are on the surface 2b of the wiring board 2 and exposed through the openings of the solder resist film 14. The lands 4 are made of, for example, a Cu material, Ni, or Au plating.

The connection pads 3a, 3b, and 3c are electrically connected to the corresponding lands 4 through internal wires 15, penetrating via holes, or the like in the wiring board 2. The lands 4 are arranged in a grid on the surface 2b of the wiring board 2 at a predetermined interval, such as the interval of 0.5 mm.

The first semiconductor chip 6 is disposed over substantially the center of the surface 2a of the wiring board 2 through a fixing member 13, such as an insulating adhesive or a DAF (Die Attached Film). The first semiconductor chip 6 is substantially rectangular in plane view. A predetermined circuit, such as a logic circuit or a memory circuit, is formed on a surface 6a of the first semiconductor chip 6.

Multiple first electrode pads 10a are aligned along sides of the surface 6a of the first semiconductor chip 6. A passivation film (not shown) covers the surface 6a of the first semiconductor chip 6 excluding regions of the first electrode pads 10a to protect the circuit formation surface.

The first electrodes pads 10a on the first semiconductor chip 6 are electrically connected to the corresponding connection pads 3a on the wiring board 2 through the conductive wires 11a made of, for example, Au or Cu. Thus, the first semiconductor chip 6 is electrically connected to the lands 4 through the wires 11a, the connection pads 3a, and the internal wires 15.

The spacer 7 is stacked over the first semiconductor chip 6 through the insulating fixing member 13. The third semiconductor chip 8 is stacked over the spacer 7 through the insulating fixing member 13.

Multiple third electrode pads 10c are aligned along sides of an upper surface 8a of the third semiconductor chip 8. A passivation film (not shown) covers the surface 8a of the third semiconductor chip 8 excluding regions of the third electrode pads 10c to protect the circuit formation surface.

The third electrode pads 10c on the third semiconductor chip 8 are electrically connected to the corresponding connection pads 3c on the wiring board 2 through the conductive wires 11c.

The second semiconductor chip 9 is stacked over the third semiconductor chip 8 through the insulating fixing member 13. Multiple second electrode pads 10b are aligned along sides of an upper surface 9a of the second semiconductor chip 9. A passivation film (not shown) covers the surface 9a of the second semiconductor chip 9 excluding regions of the second electrode pads 10b to protect the circuit formation surface.

The second electrodes pads 10b on the second semiconductor chip 9 are electrically connected to the corresponding connection pads 3b on the wiring board 2 through the conductive wires 11b.

The seal 12 covers substantially the entire surface 2a of the wiring board 2 so as to cover the semiconductor chips 6, 8, and 9, and the wires 11a, 11b, and 11c. The seal 12 is made of a thermosetting resin, such as an epoxy resin. The seal 12 has a thickness of approximately 400 μm.

As the external terminals 5, solder balls that are bumps are mounted in a grid on the corresponding lands 4 on the surface 2b of the wiring board 2.

Recently, demands for packaging a radio frequency (RF) chip together with a memory chip and a logic chip have been increasing with the progress of BGA semiconductor devices having a multi-chip packaging structure.

The radio frequency chip is likely to generate high frequency noises outside the chip compared to other semiconductor chips. Additionally, the radio frequency chip is likely to malfunction if subjected to radio frequency noises or noises caused by a power source variation. The memory chip consumes much current in a wiring operation, and therefore noises caused by a power source variation are likely to be generated.

FIG. 3 illustrates variations in voltages of a power source and the ground of the memory chip. As understood from FIG. 3, the power source in the memory chip and the potential of the ground are not stable in an actual operation, thereby causing a variation in voltage if a large amount of current flows in a memory writing process or in an output switching process.

To reduce the variation in voltage and to prevent malfunction of the chip, it is effective to reduce impedance of the power source or the ground. As general countermeasures, the widths of wirings of the power source and the ground are increased to increase capacity. Additionally, multiple wiring paths are provided to reduce the resistance. Alternatively, a decoupling capacitor for preventing power noises is inserted.

However, these countermeasures cannot be taken for high-density semiconductor devices. To package the radio frequency chip together with the memory chip and the like, the effects of radio frequency noises have to be prevented. For this reason, various countermeasures, such as an increase in distance among chips, and design and preproduction of shields and substrate wirings, are required so as not to cause characteristic defects.

Further, various countermeasures for reducing impedance are required so as to prevent noises caused by a power source variation. However, no effective countermeasure has been proposed.

SUMMARY

In one embodiment, a semiconductor device includes first to third semiconductor chips. The second semiconductor chip is stacked over the first semiconductor chip. The third semiconductor chip is stacked over the second semiconductor chip. The second semiconductor chip shields the first semiconductor chip from noises generated by the third semiconductor chip. The second semiconductor chip shields the third semiconductor chip from noises generated by the first semiconductor chip.

Accordingly, noises generated by the first semiconductor chip and noises generated by the third semiconductor chip can be prevented from affecting each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. The accompanying drawings explain a semiconductor device in the embodiments. The size, the thickness, and the like of each illustrated portion might be different from those of each portion of an actual semiconductor device.

Those skilled in the art will recognize that many alternative embodiments can be accomplished using the teaching of the present invention and that the invention is not limited to the embodiments illustrated for explanatory purpose.

Figure 1:
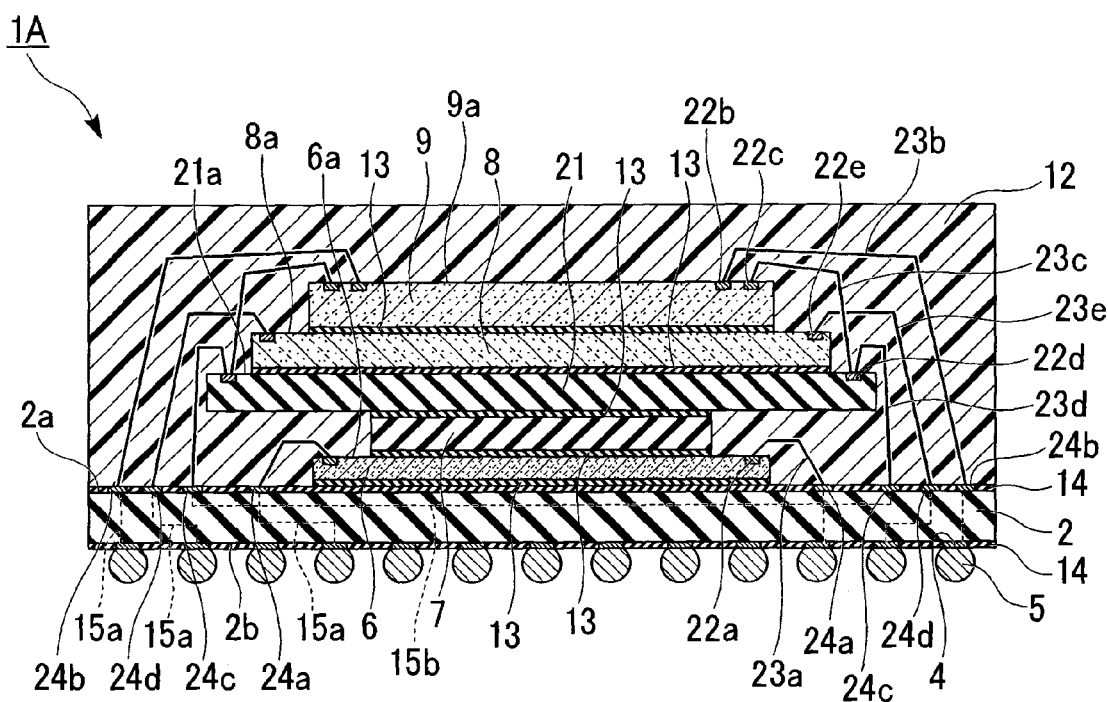
FIG. 1 is a cross-sectional view illustrating a semiconductor device according to a first embodiment of the present invention.
Figure 2:
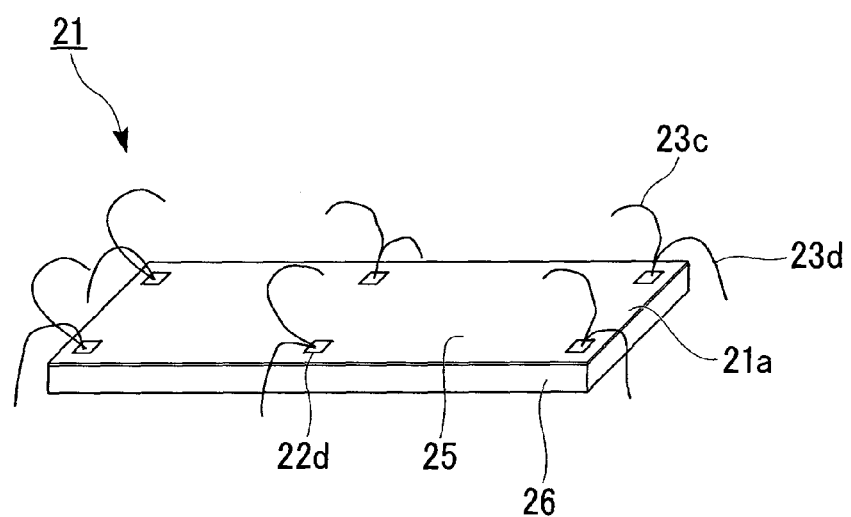
FIG. 2 is an oblique view illustrating a conductive coating chip included in the semiconductor device.
Figure 3:
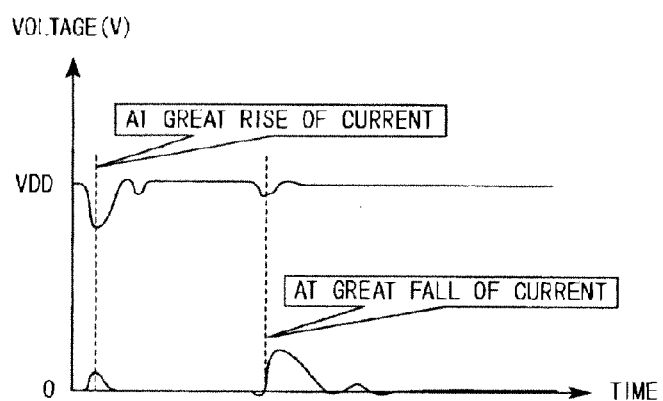
FIG. 3 is a graph illustrating variations in voltages of a power source and the ground of a memory chip.
Figure 4:
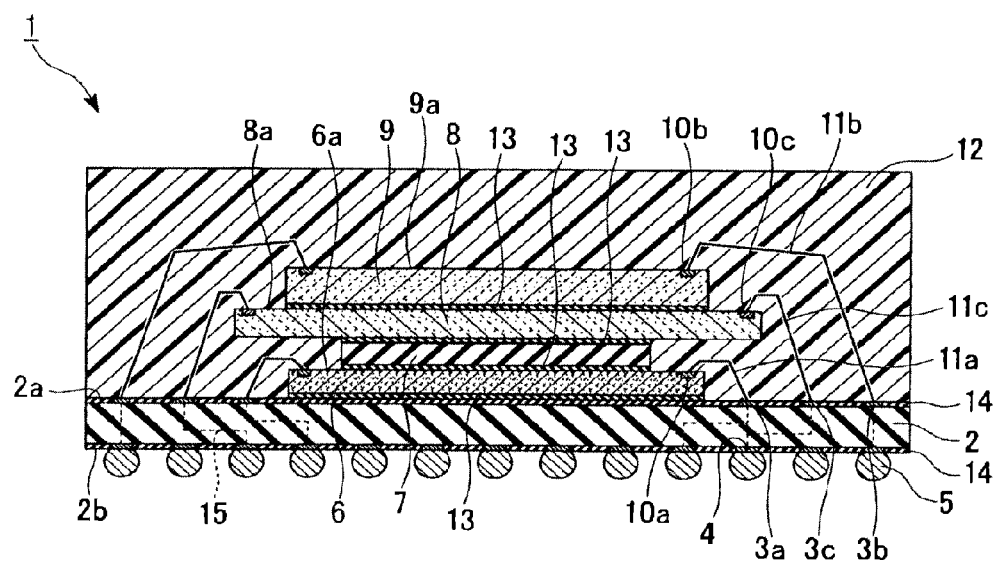
FIG. 4 is a cross-sectional view illustrating a BGA semiconductor device of a related art.

FIG. 1 is a cross-sectional view illustrating a semiconductor device 1A according to a first embodiment of the present invention. FIG. 2 is an oblique view illustrating a conductive coating chip included in the semiconductor device 1A.

The semiconductor device 1A includes: a wiring board 2 having an upper surface 2a with multiple connection pads 24a, 24b, 24c, and 24d thereon and a lower surface 2b with multiple lands 4 thereon electrically connected to the respective connection pads 24a, 24b, 24c, and 24d; a first semiconductor chip 6 over the surface 2a of the wiring board 2; a spacer 7 stacked over the first semiconductor chip 6; a conductive coating chip 21 stacked over the spacer 7; a third semiconductor chip 8 stacked over the conductive coating chip 21; a second semiconductor chip 9 stacked over the third semiconductor chip 8; wires 23a, 23b, 23c, 23d, and 23e; a seal 12 made of an insulating resin covering at least the semiconductor chips 6, 8, and 9, the conductive coating chip 21, and the wires 23a, 23b, 23c, 23d, and 23e; and external terminals 5 that are solder balls or the like on the lands 4. The connection pads 24c are not electrically connected to the lands 4.

The wiring board 2 is substantially rectangular in plane view (i.e., when viewed in a direction perpendicular to the surfaces 2a and 2b thereof). The wiring board 2 is, for example, a glass epoxy board having a thickness of, for example, 0.25 mm. Wirings (not shown) are provided on both surfaces of the glass epoxy board. The wirings are covered by a solder resist film 14 that is an insulating film having multiple openings (not shown).

The connection pads 24a, 24b, 24c, and 24d are provided on the wirings that are on the surface 2a of the wiring board 2 and exposed through the openings of the solder resist film 14. The lands 4 are provided on the wirings that are on the surface 2b of the wiring board 2 and exposed through the openings of the solder resist film 14. The lands 4 are made of, for example, a Cu material, Ni, or Au plating.

The connection pads 24a, 24b, and 24d are electrically connected to the corresponding lands 4 through internal wires 15a, penetrating via holes, or the like in the wiring board 2. The connection pads 24c are electrically connected to each other through internal wires 15b in the wiring board 2. The lands 4 are arranged in a grid on the surface 2b of the wiring board 2 at a predetermined interval, such as an interval of 0.5 mm.

The first semiconductor chip 6 is disposed over substantially the center of the surface 2a of the wiring board 2 through a fixing member 13, such as an insulating adhesive or a DAF (Die Attached Film). The first semiconductor chip 6 is substantially rectangular in plane view. A predetermined circuit, such as a logic circuit or a memory circuit, is formed on a surface 6a of the first semiconductor chip 6.

Multiple first electrode pads 22a are aligned along sides of the surface 6a of the first semiconductor chip 6. A passivation film (not shown) covers the surface 6a of the first semiconductor chip 6 excluding regions of the first electrode pads 22a to protect the circuit formation surface.

The first electrode pads 22a on the first semiconductor chip 6 are electrically connected to the corresponding first connection pads 24a on the wiring board 2 through the first conductive wires 23a made of, for example, Au or Cu.

Thus, the first semiconductor chip 6 is electrically connected to the lands 4 through the first wires 23a, the first connection pads 24a, and the internal wires 15a. In the first embodiment, a radio frequency chip is used as the first semiconductor chip 6.

The spacer 7 is stacked over the first semiconductor chip 6 through the insulating fixing member 13. The conductive coating chip 21 is stacked over the spacer 7 through the insulating fixing member 13.

The conductive chip 21 is larger in area than the first to third semiconductor chips 6, 9, and 8 in plane view. In other words, the outer edge of the conductive chip 21 is outside outer edges of the first to third semiconductor chips 6, 9, and 8 in plane view.

According to this structure, the conductive coating chip 21 functions as a shield, thereby shielding against strong direct radio frequency noises and electromagnetic noises generated between the first semiconductor chip 6 and the second and third semiconductor chips 9 and 8.

As shown in FIG. 2, the conductive coating chip 21 includes a silicon chip 26 and a conductor 25. The conductor 25 is, for example, Al, and coats a surface 21a of the conductive coating chip 21.

Multiple fourth electrode pads 22d are aligned along sides of the surface 21a of the conductive coating chip 21. Third and fourth wires 23c and 23d are connected to the fourth electrode pads 22d.

The third semiconductor chip 8 is stacked over the conductive coating chip 21 through the insulating fixing member 13. Multiple fifth electrode pads 22e are aligned along sides of an upper surface 8a of the third semiconductor chip 8. A passivation film (not shown) covers the surface 8a of the third semiconductor chip 8 excluding regions of the fifth electrode pads 22e to protect the circuit formation surface.

The fifth electrode pads 22e on the third semiconductor chip 8 are electrically connected to the corresponding fourth connection pads 24d on the wiring board 2 through the fifth conductive wires 23e.

Thus, the third semiconductor chip 8 is electrically connected to the lands 4 through the fifth wires 23e, the fourth connection pads 24d, and the internal wires 15a. A DRAM memory chip is used as the third semiconductor chip 8 in the first embodiment.

The second semiconductor chip 9 is stacked over the third semiconductor chip 8 through the insulating fixing member 13. Multiple second and third electrode pads 22b and 22c are aligned along sides of an upper surface 9a of the second semiconductor chip 9. A passivation film (not shown) covers the surface 9a of the second semiconductor chip 9 excluding regions of the second and third electrode pads 22b and 22c to protect the circuit formation surface.

The second electrode pads 22b on the second semiconductor chip 9 are electrically connected to the corresponding second connection pads 24b on the wiring board 2 through the second conductive wires 23b.

Thus, the second semiconductor chip 9 is electrically connected to the lands 4 through the second wires 23b, the second connection pads 24b, and the internal wires 15a. In the first embodiment, a logic chip is used as the second semiconductor chip 9.

The third electrode pads 22c on the second semiconductor chip 9 are electrically connected to the corresponding fourth electrode pads 22d on the conductive coating chip 21 through third wires 23c. The fourth electrode pads 22d on the conductive coating chip 21 are electrically connected to the corresponding third connection pads 24c on the wiring board 2 through fourth wires 23d.

Thus, the conductive coating chip 21, the second semiconductor chip 9 that is the voltage variation source, and the wiring board 2 that is the ground are connected through the short wires 23c and 23d, thereby enabling a reduction in impedance.

Additionally, the conductor 25 coats the surface 21a of the conductive coating chip 21, thereby increasing the electric capacity of the conductive coating chip 21, and therefore shielding against noise caused by a variation in voltage.

The seal 12 covers substantially the entire surface 2a of the wiring board 2 so as to cover the semiconductor chips 6, 8, and 9, the conductive coating chip 21, and the wires 23a, 23b, 23c, 23d, and 23e. The seal 12 is made of a thermosetting resin, such as an epoxy resin. The seal 12 has a thickness of approximately 400 μm.

As the external terminals 5, solder balls that are bumps are mounted in a grid on the corresponding lands 4 on the surface 2b of the wiring board 2.

According to the first embodiment, the conductive coating chip 21 between the first semiconductor chip 6 that is the radio frequency chip and a set of the second and third semiconductor chips 9 and 8 functions as a shield.

Therefore, strong radio frequency noises and electromagnetic noises generated between the first semiconductor chip 6 and a set of the second and third semiconductor chips 9 and 8 can be shielded.

Consequently, radio frequency noises generated by the first semiconductor chip 6 and radio frequency noises generated by the second and third semiconductor chips 9 and 8 are prevented from affecting each other.

Additionally, the conductive coating chip 21 is larger in size than the semiconductor chips 6, 8, and 9 in plane view, thereby enhancing the shielding function of the conductive coating chip 21.

Consequently, radio frequency noises generated by the first semiconductor chip 6 and radio frequency noises generated by the second and third semiconductor chips 9 and 8 are prevented from affecting each other.

Further, the conductive coating chip 21 is electrically connected, through the wires 23c, to the second semiconductor chip 9 that is a memory chip as a source of a variation in voltage, thereby reducing impedance, and therefore preventing noises causing a variation in voltage.

Moreover, the conductive coating chip 21 is electrically connected to the wiring board 2 through the wires 23d, thereby reducing impedance and therefore preventing noises causing a variation in voltage.

It is apparent that the present invention is not limited to the above embodiments, but may be modified and changed without departing from the scope and spirit of the invention.

For example, although the three semiconductor chips are stacked in the first embodiment, more semiconductor chips may be stacked through more spacers.

The present invention is widely applicable to semiconductor-device manufacturing industries.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

What is claimed is:

1. A semiconductor device comprising:
   a first semiconductor chip;
   a second semiconductor chip stacked over the first semiconductor chip; and
   a third semiconductor chip stacked over the second semiconductor chip,
   wherein the second semiconductor chip shields the first semiconductor chip from noises generated by the third semiconductor chip, and the second semiconductor chip shields the third semiconductor chip from noises generated by the first semiconductor chip, and
   wherein the second semiconductor chip is electrically connected to the third semiconductor chip.

2. The semiconductor device according to claim 1, wherein outer edges of the first and third semiconductor chips are aligned to or inside an outer edge of the second semiconductor chip in plane view.

3. The semiconductor device according to claim 1, wherein the first and third semiconductor chips are a radio frequency chip and a memory chip, respectively.

4. The semiconductor device according to claim 1, wherein a surface of the second semiconductor chip is coated by a conductor.

5. The semiconductor device according to claim 1, further comprising: a spacer between the first and second semiconductor chips.

6. The semiconductor device according to claim 1, further comprising:
  a wiring board having first and second regions, the first region being covered by the first semiconductor chip;
  a plurality of first and second connection pads in the second region;
  a plurality of first electrode pads aligned along sides of the first semiconductor chip, the plurality of first electrode pads being electrically connected to the plurality of first connection pads;
  a plurality of second electrode pads aligned along sides of the second semiconductor chip, the plurality of second electrode pads being electrically connected to the plurality of second connection pads; and
  a plurality of third and fourth electrode pads aligned along sides of the third semiconductor chip, the plurality of third electrode pads being electrically connected to the plurality of first connection pads, and the plurality of fourth electrode pads being electrically connected to the plurality of second electrode pads.

7. The semiconductor device according to claim 6, further comprising:
  a plurality of lands fixed to the wiring board, the plurality of lands being on an opposite side of the plurality of first and second connection pads with respect to the wiring board,
  wherein the plurality of first connection pads are electrically connected to the plurality of lands.

8. The semiconductor device according to claim 6, wherein
  the plurality of first and third electrode pads are electrically connected to the plurality of first connection pads using a plurality of wires,
  the plurality of second electrode pads are electrically connected to the plurality of second connection pads using a plurality of wires, and
  the plurality of fourth electrode pads are electrically connected to the plurality of second electrode pads using a plurality of wires.

9. The semiconductor device according to claim 7, wherein the plurality of first connection pads are electrically connected to the plurality of lands using a plurality of wires penetrating the wiring board.

10. The semiconductor device according to claim 6, further comprising:
  a seal covering the second region and the first to third semiconductor chips.

11. The semiconductor device according to claim 1, further comprising:
  a fourth semiconductor chip stacked over the third semiconductor chip,
  wherein the second semiconductor chip shields the first semiconductor chip from noises generated by a set of the third and fourth semiconductor chips, and the second semiconductor chip shields the set of the third and fourth semiconductor chips from noises generated by the first semiconductor chip.

12. The semiconductor device according to claim 11, wherein outer edges of the first, third, and fourth semiconductor chips are aligned to or inside an outer edge of the second semiconductor chip in plane view.

13. The semiconductor device according to claim 11, further comprising:
  a wiring board having first and second regions, the first region being covered by the first semiconductor chip;
  a plurality of first and second connection pads in the second region;
  a plurality of first electrode pads aligned along sides of the first semiconductor chip, the plurality of first electrode pads being electrically connected to the plurality of first connection pads;
  a plurality of second electrode pads aligned along sides of the second semiconductor chip, the plurality of second electrode pads being electrically connected to the plurality of second connection pads;
  a plurality of third electrode pads aligned along sides of the third semiconductor chip, the plurality of third electrode pads being electrically connected to the plurality of first connection pads; and
  a plurality of fourth and fifth electrode pads aligned along sides of the fourth semiconductor chip, the plurality of fourth electrode pads being electrically connected to the plurality of first connection pads, and the plurality of fifth electrode pads being electrically connected to the plurality of second electrode pads.

14. The semiconductor device according to claim 13, further comprising:
  a plurality of lands fixed to the wiring board, the plurality of lands being on an opposite side of the plurality of first and second connection pads with respect to the wiring board,
  wherein the plurality of first connection pads are electrically connected to the plurality of lands.

15. The semiconductor device according to claim 13, wherein
  the plurality of first, third, and fourth electrode pads are electrically connected to the plurality of first connection pads using a plurality of wires,
  the plurality of second electrode pads are electrically connected to the plurality of second connection pads using a plurality of wires, and
  the plurality of fifth electrode pads are electrically connected to the plurality of second electrode pads using a plurality of wires.

16. The semiconductor device according to claim 14, wherein the plurality of first connection pads are electrically connected to the plurality of lands using a plurality of wires penetrating the wiring board.

17. The semiconductor device according to claim 13, further comprising:
  a seal covering the second region and the first to fourth semiconductor chips.

18. A semiconductor device comprising:
  a first semiconductor chip including a main surface and a side surface defining an edge thereof;
  a conductive layer staked over the first semiconductor chip and including a plane surface facing to the main surface without covering the side surface of the first semiconductor chip; and a second semiconductor chip stacked over the conductive layer so that the conductive layer is disposed between the first and second semiconductor chips,
wherein the conductive layer is larger in size than each of the first and second semiconductor chips.

19. The semiconductor device according to claim 18, further comprising:
a first bonding wire electrically coupling the conductive layer to the second semiconductor chip.

20. The semiconductor device according to claim 19, further comprising:
a wiring board including a connection pad thereon, and provided over the first semiconductor chip, the first semiconductor chip being disposed between the wiring board and the conductive layer; and
a second bonding wire electrically coupling the connection pad of the wiring board to the conductive layer.

21. The semiconductor device according to claim 18, wherein one of the first and second semiconductor chips is a radio frequency chip, the other of the first and second semiconductor chips is a memory chip.

22. The semiconductor device according to claim 18, further comprising:
a third semiconductor chip stacked over the second semiconductor chip, the third semiconductor chip is smaller in size than the conductive layer.

23. The semiconductor device according to claim 18, further comprising:
a spacer provided between the first semiconductor chip and the conductive layer, the spacer is smaller in size than the first semiconductor chip.

24. A semiconductor device comprising:
a wiring board;
a first semiconductor chip mounted over the wiring board;
a silicon substrate including first and second main surfaces opposite to each other and a conductive layer formed on the first main surface, the silicon substrate being stacked over the first semiconductor chip so that the second main surface of the silicon substrate faces the first semiconductor chip; and
a second semiconductor chip stacked over the conductive layer on the first main surface of the silicon substrate,
wherein the conductive layer is larger in size than each of the first and second semiconductor chips.

25. The semiconductor device according to claim 24, further comprising:
a connection pad disposed on the wiring board;
a first bonding wire electrically coupling the connection pad of the wiring board to the conductive layer of the silicon substrate; and
a second bonding wire electrically coupling the conductive layer of the silicon substrate to the second semiconductor chip.

26. The semiconductor device according to claim 25, wherein one of the first and second semiconductor chips is a radio frequency chip, the other of the first and second semiconductor chips is a memory chip.

27. The semiconductor device according to claim 25, wherein the conductive layer is formed on an entire surface of the upper surface of the silicon substrate.

28. The semiconductor device according to claim 25, further comprising;
a third semiconductor chip stacked over the second semiconductor chip, the third semiconductor chip is smaller in size than the conductive layer.

29. The semiconductor device according to claim 25, further comprising:
a spacer provided between the first semiconductor chip and the silicon substrate, the spacer is smaller in size than the first semiconductor chip; and
a bonding wire electrically coupling the wiring board to the first semiconductor chip.

* * * * *